United States Patent [19]
Hanada et al.

[11] Patent Number: 6,102,711
[45] Date of Patent: Aug. 15, 2000

[54] SOCKET FOR MOUNTING PACKAGE AND MOUNT STRUCTURE OF PACKAGE USING THE SAME

[75] Inventors: Koji Hanada; Yoshinori Uzuka; Akira Tamura; Takeshi Nishiyama, all of Kawasaki, Japan

[73] Assignee: Fujitsu Limited, Kanagawa, Japan

[21] Appl. No.: 08/996,877

[22] Filed: Dec. 23, 1997

[30] Foreign Application Priority Data

May 29, 1997 [JP] Japan ..................................... 9-140446

[51] Int. Cl.[7] .............................. H01R 12/00; H05K 1/00
[52] U.S. Cl. ............................................... 439/70; 439/526
[58] Field of Search ............................. 439/70, 526, 525, 439/73

[56] References Cited

U.S. PATENT DOCUMENTS

| | | | |
|---|---|---|---|
| 3,487,350 | 12/1969 | Hammell | 439/70 |
| 3,771,109 | 11/1973 | Bruckner et al. | 439/331 |
| 4,072,376 | 2/1978 | Shannon | 439/590 |
| 4,832,612 | 5/1989 | Grabbe et al. | 439/71 |
| 5,473,510 | 12/1995 | Dozier, II | 439/91 |
| 5,562,462 | 10/1996 | Matsuba et al. | 439/70 |
| 5,691,041 | 11/1997 | Frankeny et al. | 428/209 |
| 5,833,472 | 11/1998 | Bright | 439/70 |

FOREIGN PATENT DOCUMENTS

| | | |
|---|---|---|
| 0 611 805 | 8/1994 | European Pat. Off. . |
| 2 287 364 | 9/1995 | United Kingdom . |

*Primary Examiner*—Lincoln Donovan
*Assistant Examiner*—Hae Moon Hyeon
*Attorney, Agent, or Firm*—Armstrong, Westerman, Hattori, McLeland and Naughton

[57] ABSTRACT

A socket for mounting a package has a socket body on which the package is mounted and a plurality of contacts which are integrated in the socket body. The socket has a flexural rigidity which is smaller than a flexural rigidity of a substrate on which the socket is to be mounted.

10 Claims, 14 Drawing Sheets

SOCKET FOR MOUNTING PACKAGE AND MOUNT STRUCTURE OF PACKAGE USING THE SAME

BACKGROUND OF THE INVENTION

1. Field of the Invention

The present invention generally relates to sockets for mounting packages on printed-circuit boards, and more particularly to a socket for mounting a high-density package having hundreds of I/O pins on a printed-circuit board.

2. Description of the Related Art

Sockets have been conventionally used for mounting a conventional package having a relatively small number of I/O pins on a printed-circuit board. The socket comprises a socket body formed of synthetic resin and a plurality of contacts. The contacts are integrated in the socket body in an arrangement corresponding to the I/O pins of the package. The socket is mounted on the printed-circuit board by soldering lead parts of the contacts to pad patterns formed on the printed-circuit board. The package is mounted on the socket by inserting the I/O pins into I/O pin contact parts of the contacts.

The conventional socket has greater flexural rigidity than that of the printed-circuit boards. In this specification, the flexural rigidity of a socket or a printed-circuit board corresponds to a force which is required to cause a specific amount of bending of the socket or the printed-circuit board. That is, if a larger force is required to cause the specific amount of bending, the flexural rigidity is greater. On the contrary, if a smaller force is required to cause the specific amount of bending, the flexural rigidity is smaller.

Recently, attempts have been made to mount high-density packages (e.g., multi-chips) having hundreds of I/O pins by using sockets. The high-density packages are generally of a larger size than the conventional packages while the pitch of I/O pins of the high-density packages is as small as the conventional packages. For example, the longitudinal length of the high-density packages is typically as much as 100 mm and the pitch of the I/O pins is only about 1 mm. Accordingly, sockets for mounting the high-density packages are of a larger size with the longitudinal length being about 100 mm for example, while the pitch of lead parts of contacts is as small as 1 mm.

Therefore, if sockets for mounting the high-density packages are designed in accordance with the socket technology for the conventional packages, bending of the sockets may have a considerable effect on the reliability of soldering connections between the lead parts of the contacts and the pad patterns on the printed-circuit board. In this case, the sockets may not be mounted on the printed-circuit board with sufficient strength.

Figure 1:
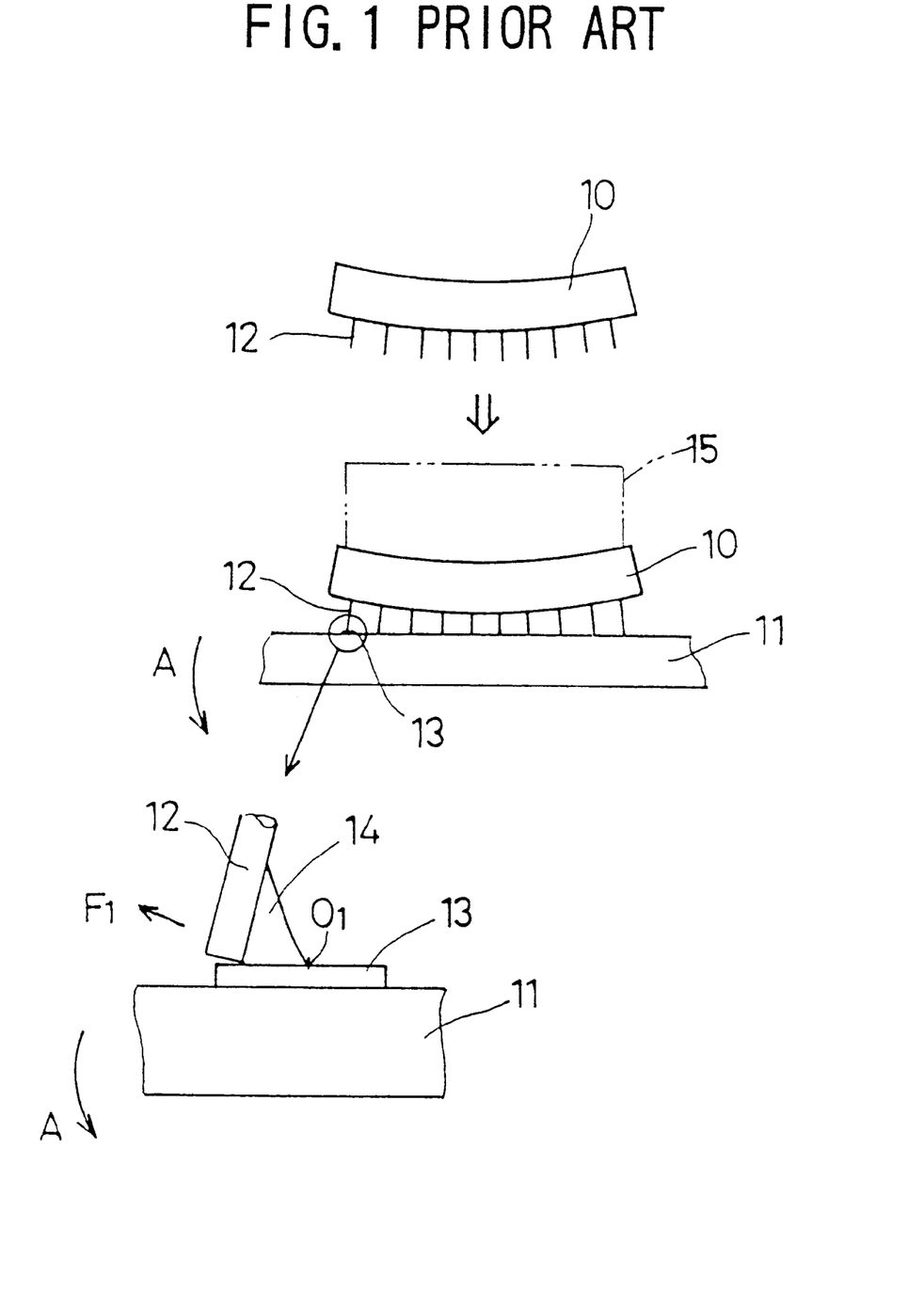
FIG. 1 is a diagram illustrating a problem of conventional sockets.

FIG. 1 is a diagram showing the above problem of the conventional sockets. A socket 10 is mounted on a printed-circuit board 11 with lead parts 12 being soldered to pad patterns 13 formed on the printed-circuit board 11. The solder is indicated by a reference numeral 14. A high-density package 15 is mounted on the socket 10. As shown in FIG. 1, the socket 10 is bent with its center part being downward. Thus, the lead parts 12 which are disposed near the edge of the socket 10 have been displaced from the center $O_1$ of the pad patterns 13 so that the lead parts 12 face the edge part of the pad patterns 13, as shown in an enlarged and exaggerated manner in FIG. 1. In this case, the lead parts are soldered only on a portion of the circumference thereof and thus the amount of the solder 14 which connects the lead parts 12 to the pad patterns 13 is reduced. Therefore, some of the lead parts 12 can not be soldered to the pad patterns 13 with sufficient strength.

As the size of a socket becomes larger, the socket tends to bend more easily. It is difficult to suppress the bending of the socket even if the thickness of the socket is reduced by modifying the shapes of molds which are used in molding the socket.

When an electronic apparatus which contains the circuit board 11 with the high-density package 15 mounted thereon is subjected to a shock, cracks may occur at portions where the lead parts 12 are not soldered to the pad patterns 13 with sufficient strength. In this case, electric conduction between the lead parts 12 and the pad patterns 13 may be broken, and thus the operation of the electronic apparatus may be stopped.

In addition, the printed-circuit board 11 tends to bend due to heat generated by the operation of the electronic apparatus which contains the printed-circuit board 11. Conventional sockets in general have greater flexural rigidity than that of printed-circuit boards. For this reason, the socket 10 does not bend to follow the bending of the printed-circuit board 11. Thus, when the printed-circuit board 11 has bent in a direction A, a considerably large force $F_1$ is generated which biases the lead parts 12 out of the pad patterns 13, as shown in FIG. 1. The force $F_1$ may break the soldering connections between the lead parts 12 and the pad patterns 13.

SUMMARY OF THE INVENTION

Accordingly, it is an object of the present invention to provide a socket which can obviate the above problems by improving a strength with which a socket is mounted on a printed-circuit board.

The above object of the present invention is achieved by a socket for mounting a package having a socket body on which the package is mounted and a plurality of contacts which are integrated in the socket body, wherein the socket has a flexural rigidity which is smaller than the flexural rigidity of a substrate on which the socket is to be mounted.

Figure 2A:
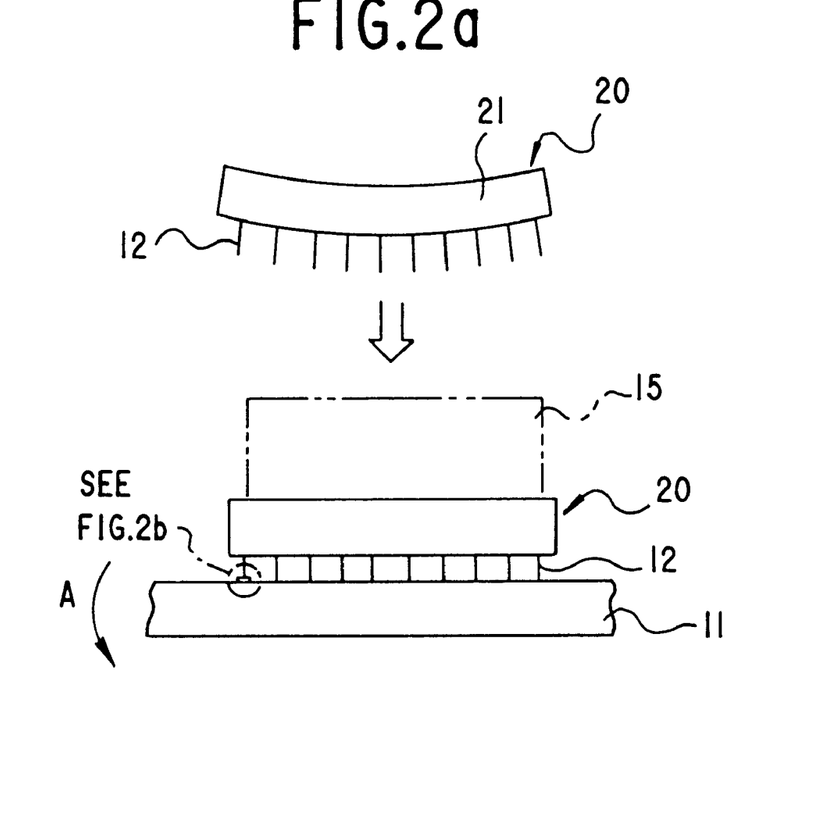
FIG. 2 is a diagram illustrating a principle of the present invention.
Figure 2B:
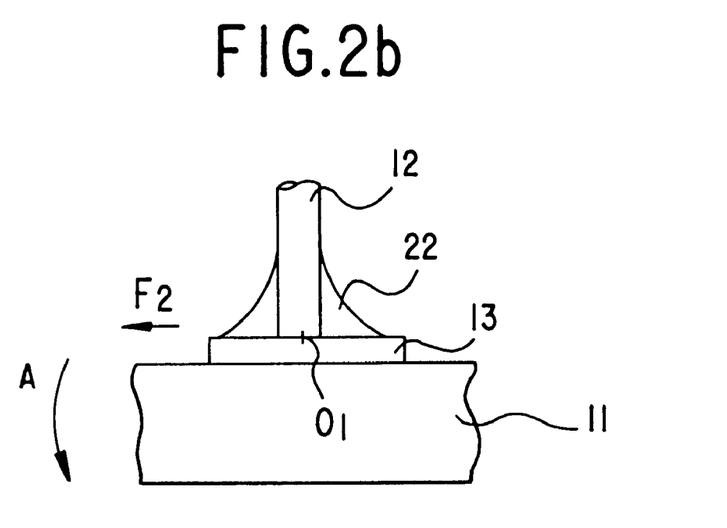
Figure 3A:
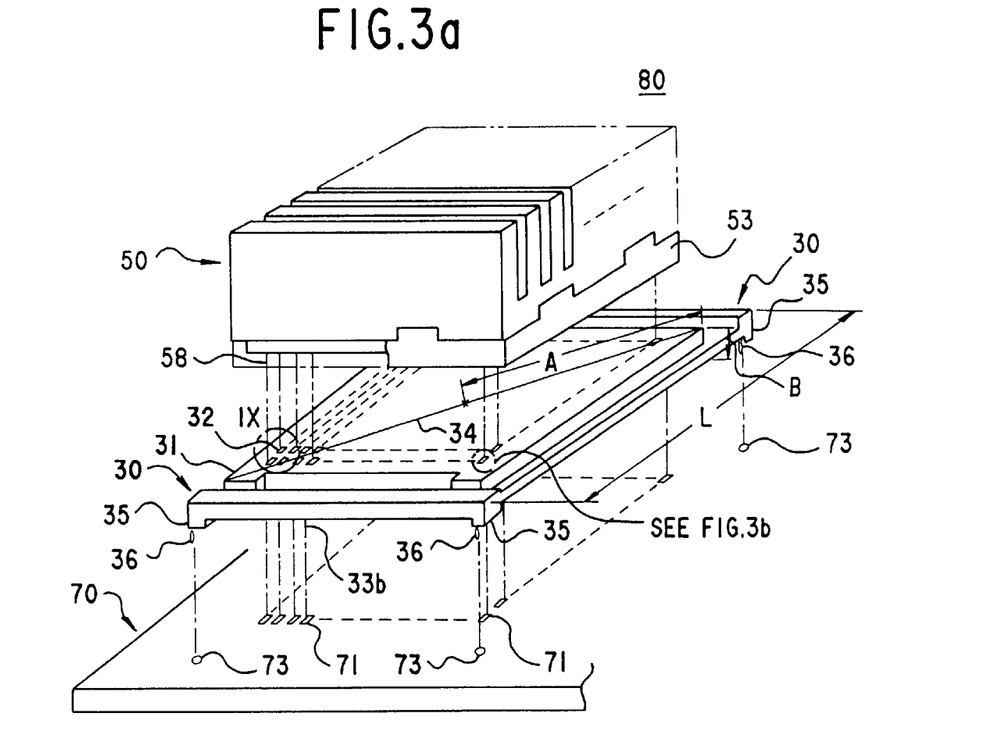
FIG. 3 is a perspective view showing a socket of a first embodiment of the present invention together with a high-density package and a printed-circuit board.
Figure 3B:
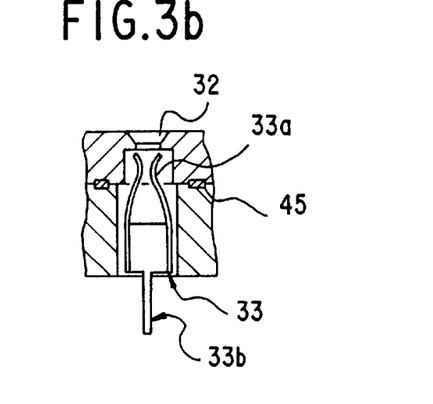

FIG. 2 illustrates a principle of the present invention. In FIG. 2, those parts which are the same as those corresponding parts in FIG. 1 are designated by the same reference numerals. As shown in FIG. 2, a socket 20 comprises a socket body 21. The socket body 21 is designed so that the flexural rigidity of the socket 20 is smaller than that of the printed-circuit board 11 on which the socket 20 is mounted.

In the following descriptions, it is assumed that the socket 20 is bent with its center part being downward before the socket 20 is mounted on the printed-circuit board 11, in the same manner as the socket 10 shown in FIG. 1.

The socket 20 is mounted on the printed-circuit board 11 by pressing the socket 20 against the printed-circuit board 11 and soldering the lead parts 12 of the contacts to the pad patterns 13 formed on the printed-circuit board 11. Since the socket 20 is so flexible that the flexural rigidity thereof is smaller than that of the printed-circuit board 11 as described above, the socket 20 is straightened along the surface of the printed-circuit board 11 so that the bending of the socket 20 is eliminated when the socket 20 is pressed against the printed-circuit board 11. Thus, the lead parts 12 disposed near the edges of the socket 20 face the neighborhood of the center $O_1$ of the pad pattern 13 as well as the lead parts 12 disposed near the center of the socket 20. In this way, all of the lead parts 12 can be soldered on the whole circumferences thereof with a sufficient amount of solder 22. Therefore, all of the lead parts 12 are securely connected to the pad patterns 13 and the socket 20 is mounted on the printed-circuit board 11 with sufficient strength.

In addition, it is possible to prevent cracks of the solder 22 even if an electronic apparatus which contains the printed-circuit board 11 is subjected to a shock.

Further, the printed-circuit board 11 may bend due to heat generated by the operation of the electronic apparatus which contains the printed-circuit board 11. When the printed-circuit board 11 is bent in the direction A as shown in FIG. 2, the socket 20 tends to bend to follow the bending of the printed-circuit board 11 since the flexural rigidity of the socket 20 is smaller than that of the printed-circuit board 11. Thus, a force $F_2$ which biases the lead parts 12 out of the pad patterns 13 is smaller than the force $F_1$ shown in FIG. 1. Consequently, it is possible to prevent the lead parts 12 from being disconnected from the solder 22 and thus troubles due to the disconnection can be eliminated. In this way, the reliability of the apparatus is efficiently improved.

As the flexural rigidity of the socket 20 is smaller, the socket 20 tends to bend to follow the bending of the printed-circuit board 11 more closely. In this case, the lead parts 12 are positioned closer to the center $O_1$ of the pad patterns 13 and the force $F_2$ becomes smaller. From this viewpoint, the flexural rigidity of the socket 20 is desirably as small as possible on the condition that the socket 20 can sufficiently hold the contact.

The socket for mounting a package may have a socket fixing part for fixing the socket body to the substrate at a plurality of positions. Hence, the socket body can bend to securely follow the bending of the substrate. Consequently, all of the lead parts can be positioned at centers of corresponding pad patterns and thus the socket can be mounted on the substrate with sufficient strength.

The socket body may have a protection cover receiving part for receiving a part of an I/O pin protection cover provided on the package when the package is mounted on the socket. Hence, the package can be mounted in a state in which the I/O pin protection cover is fitted on the package. Consequently, it is not necessary to remove the I/O pin protection cover when the package is mounted and thus it is possible to prevent I/O pins of the package from being bent.

The socket body may further have a guide part for guiding and leading the part of the I/O pin protection cover into the protection cover receiving part. Hence, if the package has been placed at a position shifted from a correct position, the package is guided and led to the correct position. Consequently, the operation of mounting the package can be smoothly carried out.

The socket body may be made of liquid crystalline polymer. Hence, the difference in the thermal expansion coefficients of polyimide which constitutes the substrate and liquid crystalline polymer is as small as 10 ppm or less. Consequently, thermal stress induced at portions where the lead parts are soldered to the pad patterns can be reduced. Thus, it is possible to further improve the reliability of the soldering connection between the lead parts and the pad patterns.

The socket body may have a shield member which encircles each of the contacts. Hence, when the package has been mounted and the I/O pins have been connected to the contacts, the I/O pins are shielded from electromagnetic noises. Consequently, it is possible to reduce distortions of electric signals. This is especially advantageous when the socket is used in applications where signals are transmitted at a high speed.

The socket body may have at least two guide pins for guiding guide holes provided on the package when the package is mounted on the socket. Hence, the package can be stably mounted on the socket being guided by the guide pins. Consequently, it is possible to prevent the I/O pins from being bent when the package is mounted.

The guide pins may have thin parts at portions which are positioned inside the guide holes in a state where the package is mounted on the socket. Hence, the package is slightly movable in a state where the package is mounted on the socket. Consequently, the socket can be of a zero-force insert type.

The guide pins may have flaps which project therefrom to prevent the package from slipping off the guide pins. Also, the socket body may have a guide support plate which horizontally extends when the socket is vertically disposed for guiding the package which has been placed thereon.

Hence, it is possible to prevent the package which is vertically disposed from falling down. Consequently, it is not necessary to manually hold the package when it is finally fixed after having been placed vertically on the socket. In this way, the operation of mounting the package vertically can be smoothly carried out.

In a mount structure of a package, the socket is mounted on a substrate and a package is mounted on the socket. Hence, it is possible to achieve a reliable mount structure which is resistant to a shock.

Other objects and further features of the present invention will be apparent from the following detailed description when read in conjunction with the accompanying drawings.

DESCRIPTION OF THE PREFERRED EMBODIMENTS

FIGS. 3 through 6 show a mount structure 80 of a high-density package 50 provided with a protection cover in which a socket 30 of a first embodiment of the present invention is applied. First, a general description of the socket 30 will be given.

The socket 30 comprises a socket body 31. The socket body 31 has a shape of A generally rectangular plate. The socket body 31 includes hundreds of through holes 32 which are aligned with each other. I/O pin contact parts 33a of contacts 33 are inserted in the through holes 32 and lead parts 33b of the contacts 33 project from the bottom face of the socket body 31, as shown in an enlarged manner in FIG. 3. The socket 30 is mounted on a printed-circuit board 70 with the lead parts 33b being soldered to pad patterns 71 formed on the printed-circuit board 70. The printed-circuit board is made of polyimide. The longitudinal length L of the socket 30 is approximately 100 mm, which length is substantially twice as large as that of the conventional sockets.

Figure 6:
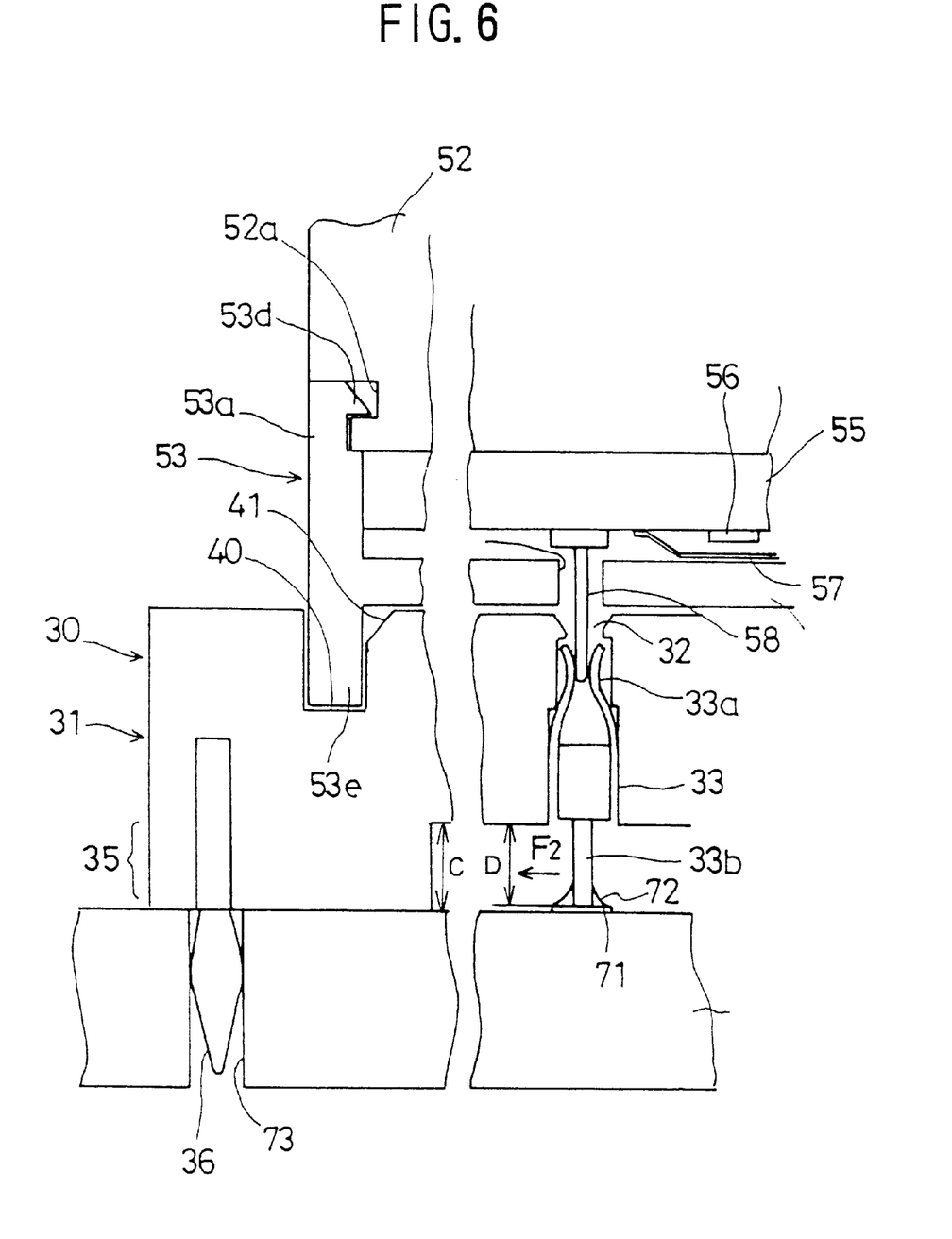
FIG. 6 is an enlarged view of the part encircled by a circle VI shown in FIG. 4.

In the mount structure 80, the high-density package 50 is mounted on the socket 30 which is in turn mounted on the printed-circuit board 70. I/O pins 58 of the high-density package 50 are inserted into the through holes 32 and are in contact with the I/O pin contact parts 33a, as shown in FIG. 6.

Figure 5:
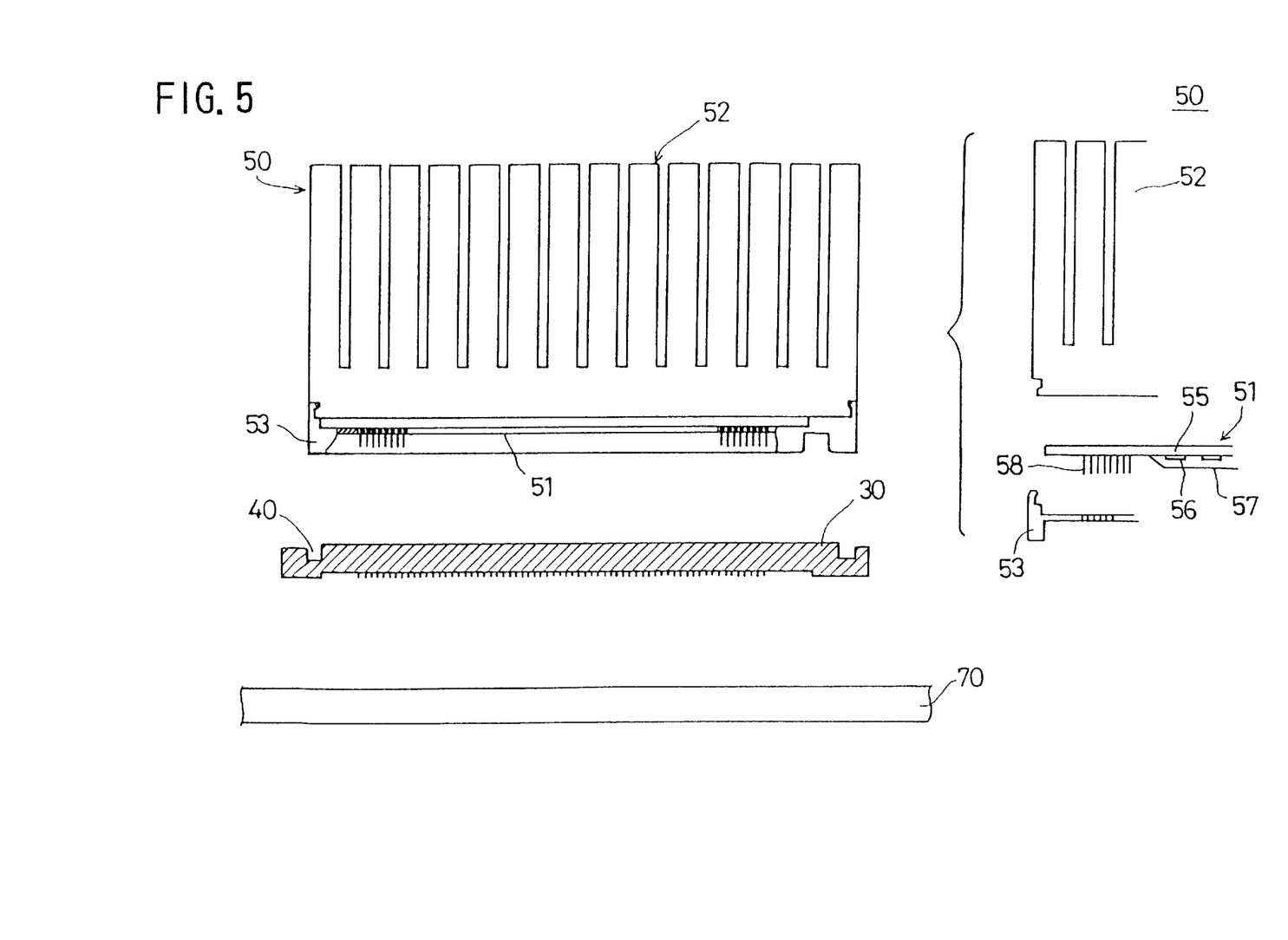
FIG. 5 is a fragmental view of FIG. 4.

The high-density package 50 comprises a package body 51, a cooling fin 52 attached to the upper surface of the package body 51, and a protection cover 53 made of synthetic resin which is fitted on the package body 51, as shown in FIG. 5.

The high-density package body 51 comprises a multilayer ceramic substrate 55. A plurality of flip chips 56 are mounted on the bottom surface of the substrate 55 and sealed by a cap 57. Hundreds of the I/O pins 58 project from the bottom surface of the substrate 55 in alignment with each other.

Next, descriptions will be given of the socket 30 which is an essential part of the present invention.

The socket body 31 is made of LCP (Liquid Crystalline Polymer) and has a shape of a generally rectangular plate having an aspect ratio of 0.11. The aspect ratio is a ratio B/A, where A is a half of the diagonal length 34 of the socket body 31 and B is the thickness of the socket body 31. Due to the above design of the socket body 31, the socket 30 is so flexible that the flexural rigidity $M_1$ thereof is smaller than the flexural rigidity $M_2$ of the printed-circuit board 70.

Consequently, when the socket 30 is mounted on the printed-circuit board 70, the socket 30 is straightened along the surface of the printed-circuit board 70 and the bending thereof is corrected, as described above with reference to FIG. 2. Thus, all of the lead parts 33b are positioned near the centers of pad patterns 71 and the whole circumferences thereof can be soldered with a sufficient amount of solder 72. In this way, all of the lead parts 33b are securely soldered to the pad patterns 71 and the socket 30 is mounted on the printed-circuit board 70 with sufficient strength. Therefore, it is possible to prevent cracks of the solder 72 when an electronic apparatus which contains the printed-circuit board 70 is subjected to a shock.

In addition, the printed-circuit board 70 tends to bend due to heat generated by the operation of the electronic apparatus which contains the printed-circuit board 70. Since the flexural rigidity $M_1$ of the socket 30 is smaller than the flexural rigidity $M_2$ of the printed-circuit board 70, the socket 30 tends to bend to follow the bending of the printed-circuit board 70. Therefore, the force $F_2$ which biases the lead parts 33b out of the pad patterns 71 is smaller than the force $F_1$. Consequently, it is possible to prevent the lead parts 33b from being disconnected from the solder 72.

The socket body 31 comprises downward projections 35 on the four corners of the bottom face. Each of the projections 35 is provided with a connecting pin 36. The connecting pin 36 has a strong resilience in its radial direction. Holes 73 are formed in the printed-circuit board 70 at positions corresponding to the connecting pins 36.

When the socket 30 is mounted on the printed-circuit board 70, the connecting pins 36 are pressed into the corresponding holes 73 of the printed-circuit board 70. The connecting pins 36 are constricted in the radial direction when pressed into the holes 73 so that the connecting pins 36 are not released from the holes 73 once they have been inserted into the holes 73.

In this way, the socket 30 is fixed on the printed-circuit board 70 with all of the projections 35 being in close contact with the printed-circuit board 70. As described above, the projections 35 are disposed in a distributed manner on the bottom face of the socket 30. Thus, the socket 30 which has the flexural rigidity $M_1$ smaller than the flexural rigidity $M_2$ of the printed-circuit board 71 tends to bend to closely follow the bending of the printed-circuit board 70. Therefore, all of the lead parts 33b are reliably fixed to the pad patterns 71 so that the socket 30 is mounted on the printed-circuit board 70 with sufficient strength.

As shown in FIG. 6, the height C of the projection 35 is larger than the length D of a part of the lead parts 33b projecting from the socket body 31. Thus, when the socket 30 is placed on a table, the lead parts 33b are not in contact with the table so that the lead parts 33b are securely prevented from being bent during handling of the socket 30.

Figure 10:
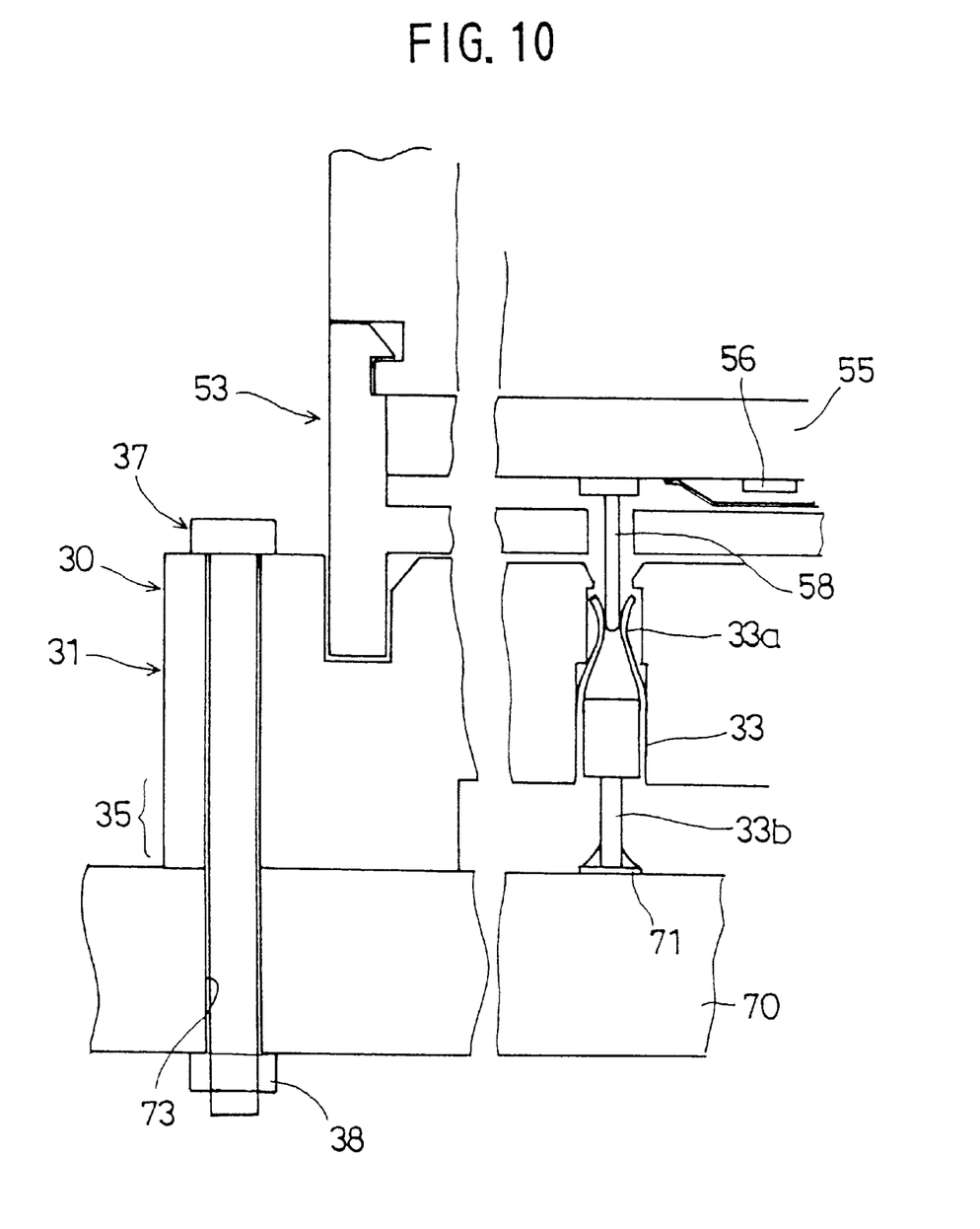
FIG. 10 is a diagram showing a first modified example of the socket of FIG. 2.

In the above construction, the socket 30 is fixed on the printed-circuit board 70 by pressing the connecting pins 36 into the holes 73. However, it is also possible to fix the socket 30 on the printed-circuit board 70 by using bolts 37 and nuts 38 as shown in FIG. 10.

The socket body 31 is made of LCP as described above. The thermal expansion coefficient $\alpha_1$ of polyimide which forms the printed-circuit board 70 is 15 ppm, for example, while the thermal expansion coefficient $\alpha_2$ of LCP is 10 ppm, for example. Thus, the difference between the thermal expansion coefficients $\alpha_1$ and $\alpha_2$ is extremely small (less than 10 ppm).

Accordingly, when the printed-circuit board 70 and socket body 31 thermally expand due to heat generated by the operation of an electronic apparatus which contains the printed-circuit board 70, thermal stress induced in the solder 72 which connects the lead parts 33b to the pad patterns 71 is reduced so that cracks of the solder 72 are more effectively eliminated.

Since the socket body 31 is constructed so that the flexural rigidity thereof is small, it is not necessary to form the socket body 31 from a highly rigid material. Therefore, the material which constitutes the socket body 31 can be selected from various kinds of material of a wider range. Consequently, it is easy to select material having a thermal expansion coefficient which is close to the thermal expansion coefficient $\alpha_1$ of polyimide which constitutes the printed-circuit board 70.

The socket body 31 has a protection cover receiving recess 40 formed along its peripheral. The protection cover receiving recess 40 receives a part of the protection cover 53 when the high-density package 50 is mounted on the socket 30.

Figure 7A:
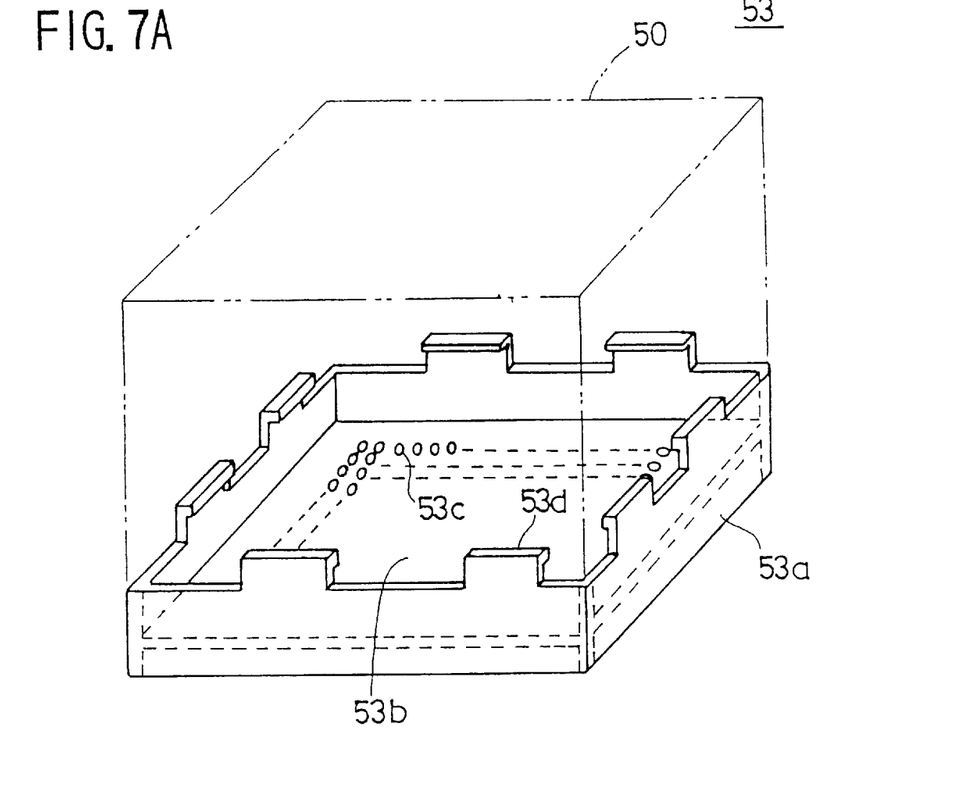
FIGS. 7A and 7B are diagrams showing a protection cover.

The protection cover 53 is made of synthetic resin. As shown in FIG. 7A, the protection cover 53 generally consists of a rectangular frame part 53a and a cover plate part 53b surrounded by the frame part 53a. The protection cover receiving recess 40 has a shape corresponding to the shape of a lower end part 53e of the frame part 53a.

Figure 7B:
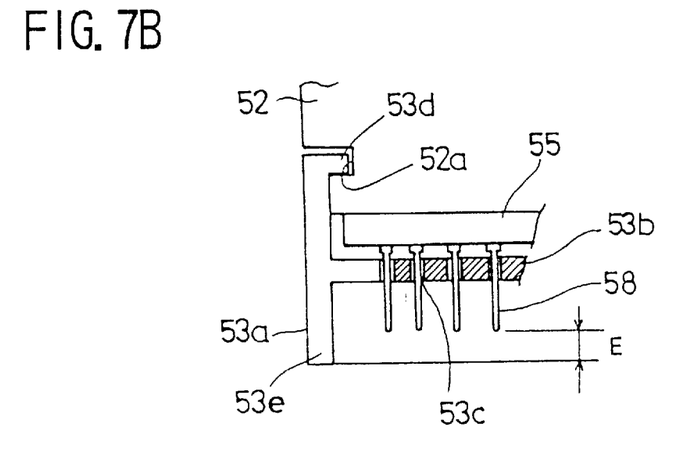

The cover plate part 53b is positioned substantially at the middle of the height of the frame part 53a. Holes 53c are formed in the cover plate part 53b at positions corresponding to the I/O pins 58. Hooks 53d are formed at the upper end of the frame part 53a. As shown in FIG. 7B, the protection cover 53 is tightly attached to the cooling fin 52 with the hooks 53d being fitted into a recess 52a formed on the peripheral of the cooling fan 52. The cover plate part 53b covers the bottom surface of the multi-layer ceramic substrate 55. The I/O pins 58 pass through the holes 53c and project downwardly therefrom. The lower ends of the I/O pins 58 are positioned at a higher level than the lower end of the frame part 53a by a dimension E. Thus, during handling of the socket 30, the I/O pins 58 are prevented from being bent by the protection cover 53 which is fitted on the high-density package 50.

Figure 4:
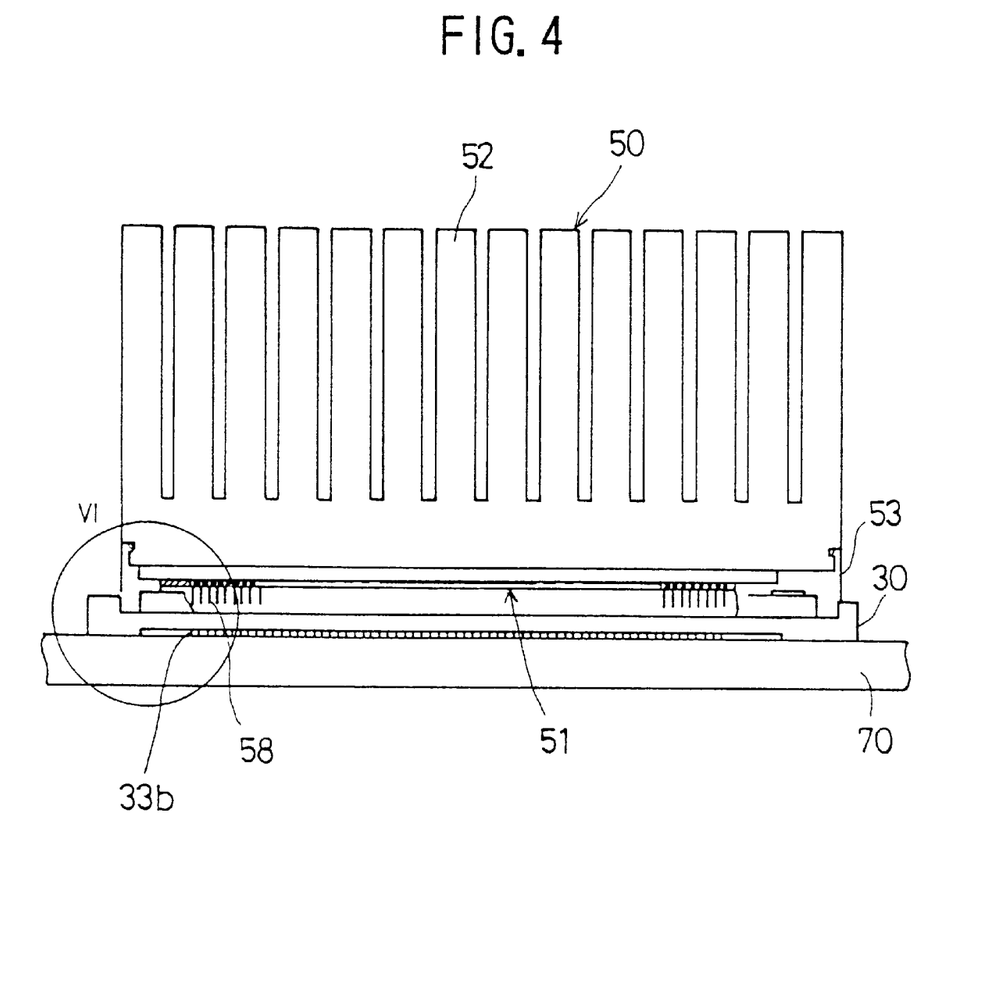
FIG. 4 is a diagram showing a mount structure in which a high-density package is mounted on the socket of FIG. 2.

Since the socket body 31 includes the protection cover receiving recess 40 as described above, it is possible to mount the high-density package 50 on the socket 30 without removing the protection cover 53. Thus, the I/O pins 58 are more effectively prevented from being bent. When the high-density package 50 is mounted on the socket 30, the lower end part 53e of the frame part 53a is accommodated in the protection cover receiving recess 40, as shown in FIGS. 4 and 6.

Figure 8:
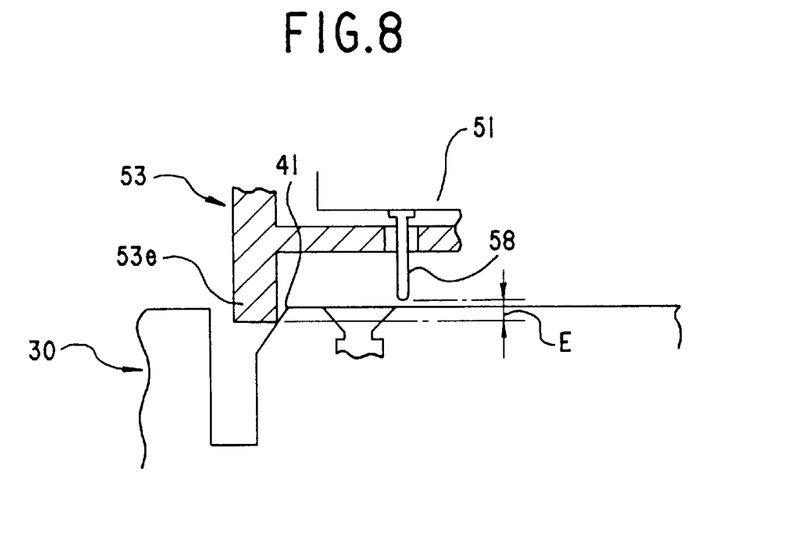
FIG. 8 is a diagram showing the function of a protection cover guide part.

As shown in FIGS. 6 and 8, the socket body 31 includes a protection cover guide part 41 in the form of a slope which is formed at the entrance part of the protection cover receiving recess 40. If the high-density package 50 is displaced from a correct position when mounted on the socket 30, the protection cover guide part 41 guides and leads the lower end part 53e of the frame part 53a toward the correct position. Thus, the high-density package 50 can be smoothly mounted on the socket 30.

In addition, since the lower ends of the I/O pins 58 are at a higher level than the lower end part 53e of the frame part 53a by the dimension E, the I/O pins 58 are not in contact with the upper surface of the socket body 31 when the bottom end part 53e is guided by the protection cover guide part 41 in the above manner.

Figure 11A:
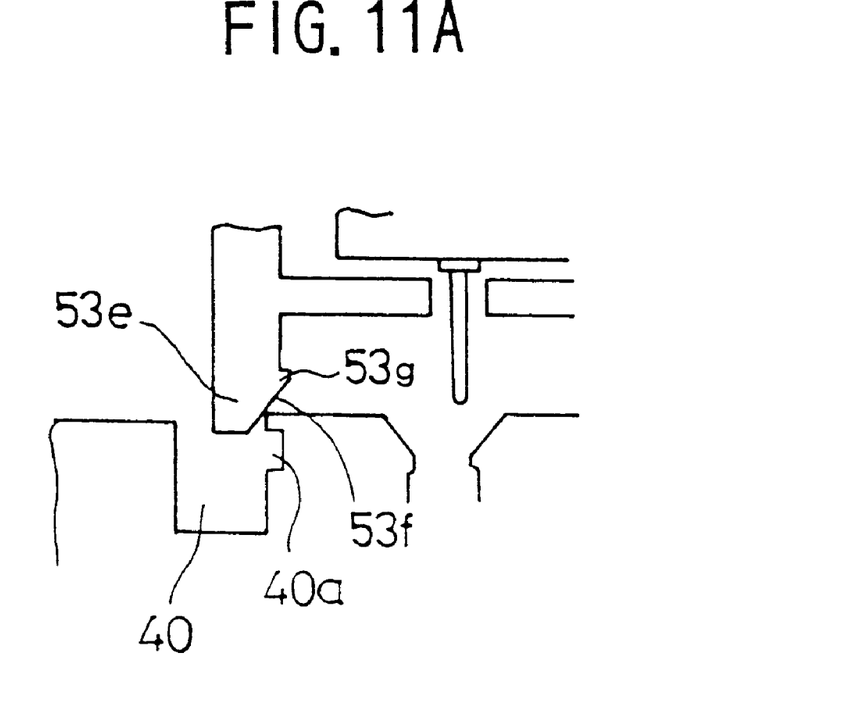
FIGS. 11A and 11B are diagrams showing a second modified example of the socket of FIG. 2.
Figure 11B:
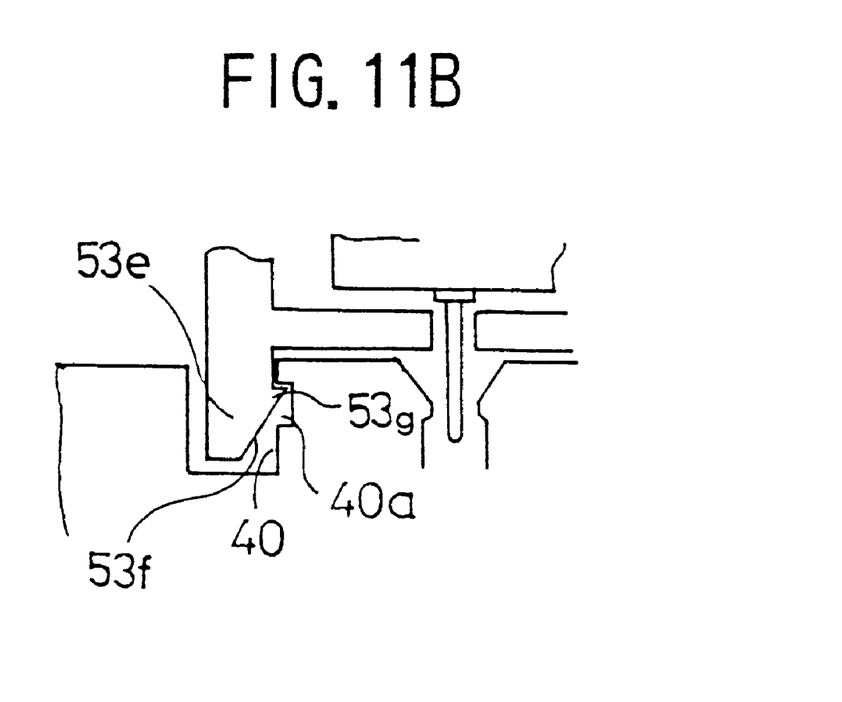

It is also possible to obtain the same function by providing a slope 53f on the inner part of the bottom end part 53e of the frame part 53a, as shown in FIGS. 11A and 11B. In the construction shown in FIGS. 11A and 11B, a hook part 53g is provided on the upper end of the slope 53f and a recess 40a is provided on the side wall of the protection cover receiving part 40. Thus, when the high-density package 50 is mounted on the socket 30, the hook part 53g is engaged with the recess 40a so that the high-density package 50 is locked.

Figure 9:
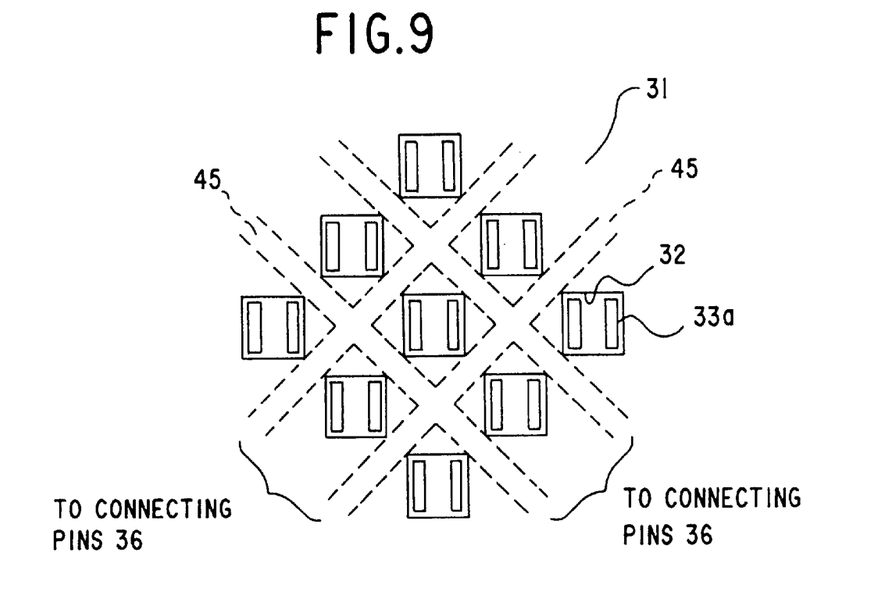
FIG. 9 is an enlarged view of the part encircled by the circle IX shown in FIG. 3.

As shown in FIG. 9, the socket body 31 includes a shield member 45 integrated therein by insert molding. The shield member 45 is a netlike member made of iron. The shield member 45 passes between neighboring through holes 32 and encircles each of the contacts 33. The shield member 45 is electrically connected to the connecting pins 36.

In a state where the socket 30 is mounted on the printed-circuit board 70, the connecting pins 36 are in contact with the ground pattern of the printed-circuit board 70 so that the shield member 45 is at a ground voltage. Thus, when the high-density package 50 is mounted on the socket 30, the I/O pins 58 and the contacts 33 are shielded from each other, respectively. Consequently, electromagnetic noises from neighboring I/O pins 58 and contacts 33 as well as electromagnetic noises from environments are effectively cut off so that electric signals can be reliably transmitted at a high speed without being affected by the electromagnetic noises and subjected to distortions.

The shield member 45 may be provided after the socket body 31 has been molded.

Figure 12:
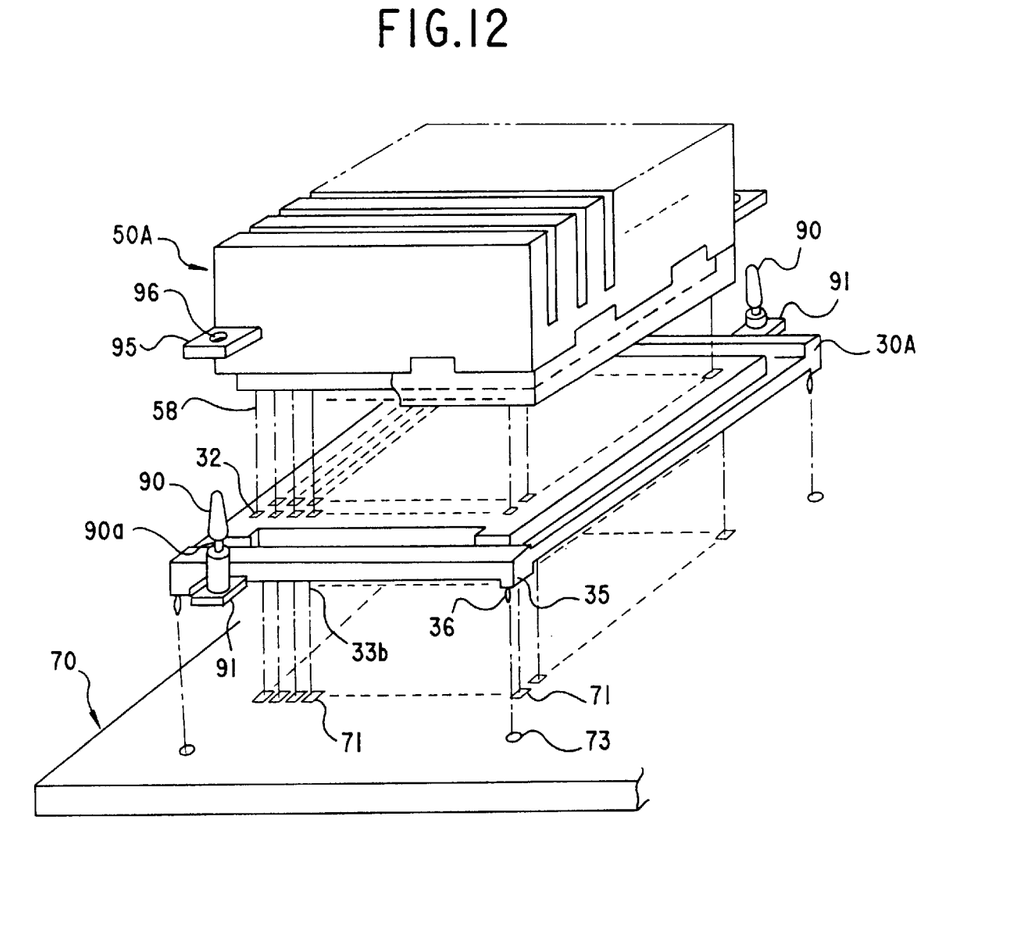
FIG. 12 is a perspective view showing a socket of a second embodiment of the present invention together with a high-density package and a printed-circuit board.

Next, descriptions will be given of sockets of other embodiments of the present invention. FIG. 12 is a diagram showing a socket 30A of a second embodiment of the present invention. The socket 30A has a pair of guide pins 90 which project upward in a vertical direction. The guide pins 90 are fixed to a pair of base parts 91, respectively, which are provided diagonally on the side faces of the socket 30A. Each of the guide pins 90 has a thin part 90a formed on the middle part thereof.

A high-density package 50A provided with a protection cover has a pair of lugs 95 which are disposed diagonally on the side faces of the cooling fin 52. Guide holes 96 are formed in the lugs 95.

Figure 13A:
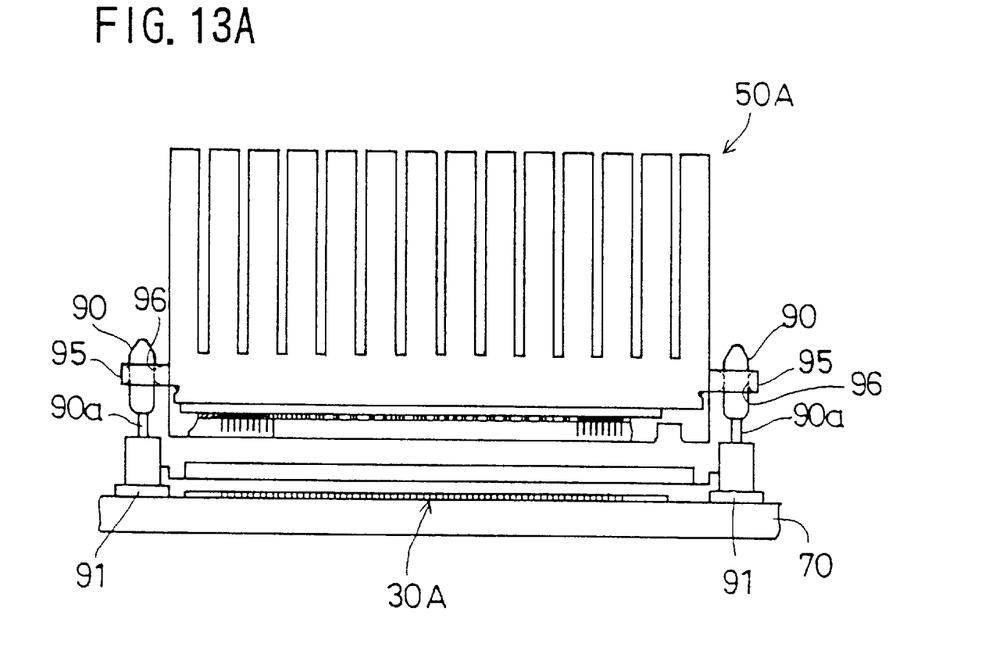
FIGS. 13A and 13B are diagrams illustrating the operation of mounting the high-density package on the socket of FIG. 12.
Figure 13B:
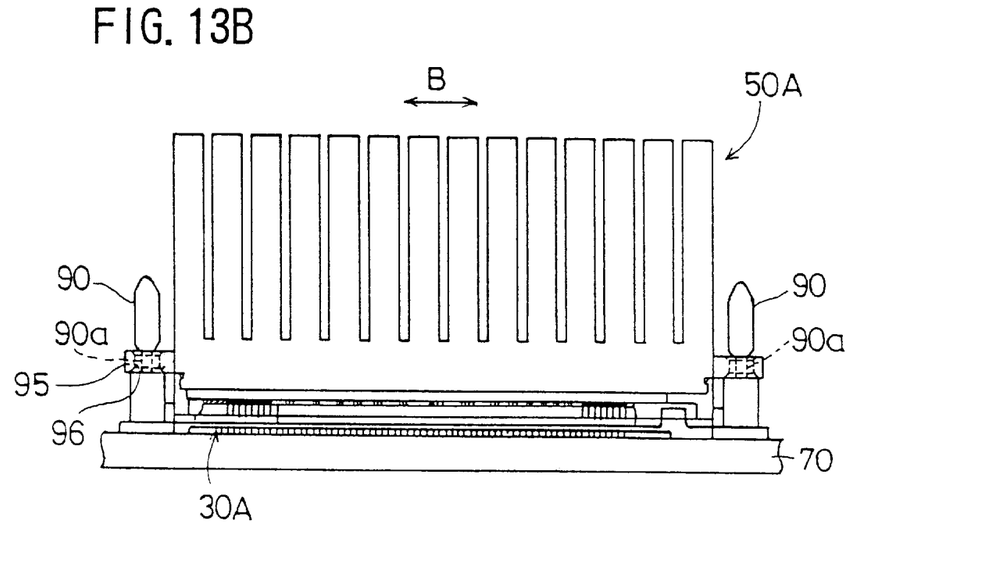

When the high-density package 50A is mounted on the socket 30A, the guide pins 90 are inserted into the guide holes 96, as shown in FIGS. 13A and 13B. Thus, the high-density package 50A is positioned at a correct position being guided by the guide pins 90. In this way, the high-density package 50A can be smoothly mounted on the socket 30A without causing bending of the I/O pins 58.

As shown in FIG. 13B, in a state where the high-density package 50A is mounted on the socket 30A, the thin parts 90a of the guide pins 90 are accommodated inside the guide holes 96 of the lugs 95 so that the high-density package 50A is movable in a direction B with respect to the socket 30A. This construction enables the movement of the high-density package 50A when, for example, the I/O pins 58 are clamped after having been inserted with zero-force insertion. Thus, the socket 30A can be of a zero-force insertion type.

Figure 14A:
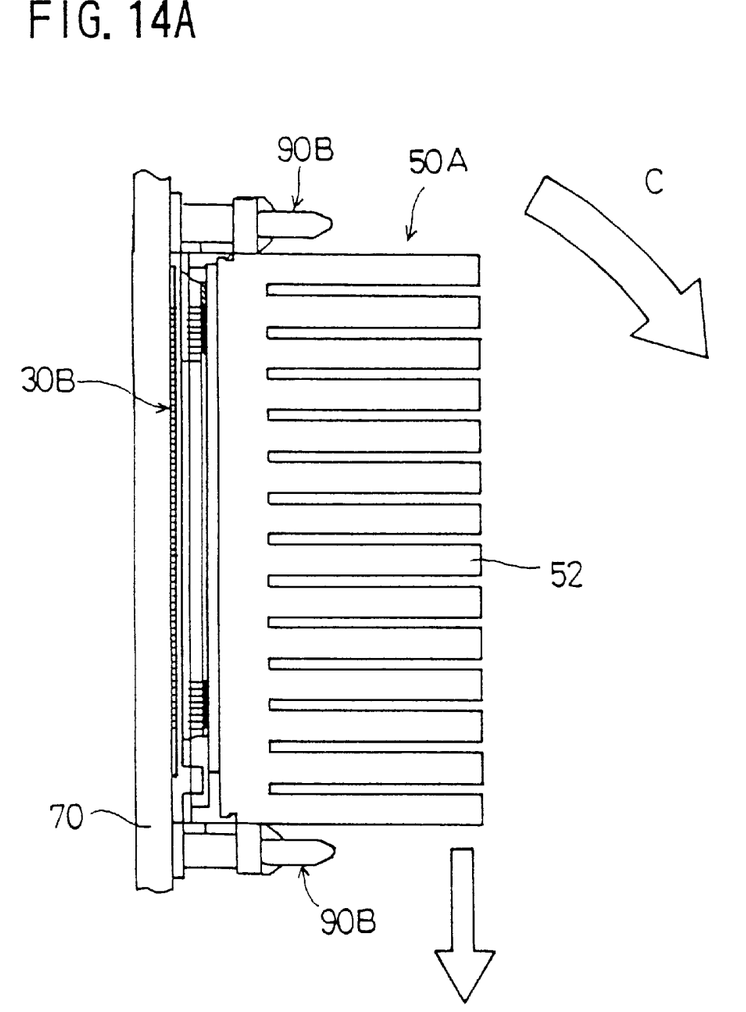
FIGS. 14A and 14B are diagrams showing a socket of a third embodiment of the present invention.
Figure 14B:
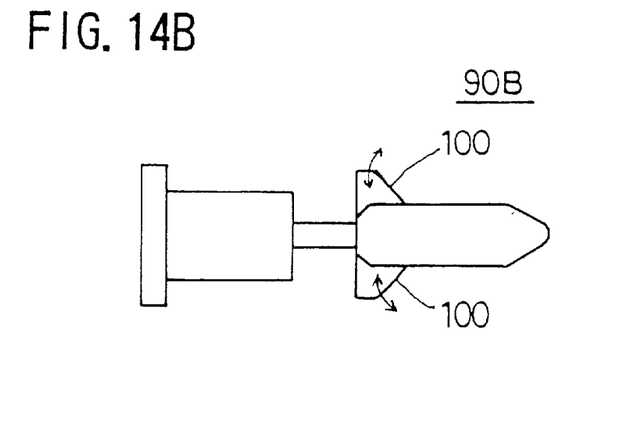

FIG. 14A is a diagram showing a socket 30B of a third embodiment of the present invention. The socket 30B comprises guide pins 90B shown in FIG. 14B instead of the guide pins 90 of the socket 30A shown in FIG. 12. The guide pins 90B have flaps 100 which are retractably attached thereon and outwardly biased by springs (not shown). The socket 30B can be used when the printed circuit board 70 is vertically disposed as shown in FIG. 14A.

When the high-density package 50A is mounted on the socket 30B which is vertically disposed, the guide pins 90B are inserted into the guide holes 96. Thus, the high-density package 50A is positioned on the socket 30B at a correct position being guided by the guide pins 90B. During the process in which the high-density package 50A is mounted on the socket 30B, the flaps 100 are once retracted into the guide pins 90B by engagement with the guide holes 96 and then project outwardly to lock the lugs 95 when the flaps 100 have passed through the guide holes 96. Thus, the flaps 100 prevent the lugs 95 from slipping off the guide pins 90B.

Although a moment acts on the high-density package 50A in a direction C due to the weight of the cooling fin 52 as shown in FIG. 14A, the lugs 95 do not slip off the guide pins 90B. Thus, it is not necessary to manually hold the high-density package 50A during the operation of fixing the high-density package 50A. From this point of view, the operation of mounting the high-density package can be easily carried out.

Figure 15A:
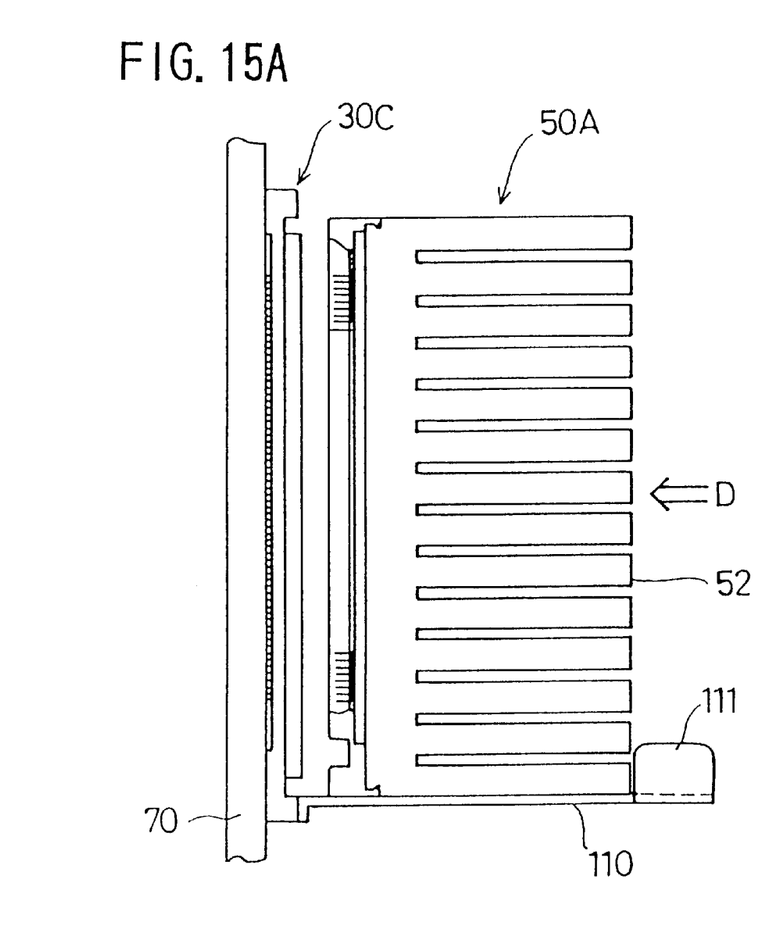
FIGS. 15A and 15B are diagrams showing a socket of a fourth embodiment of the present invention.
Figure 15B:
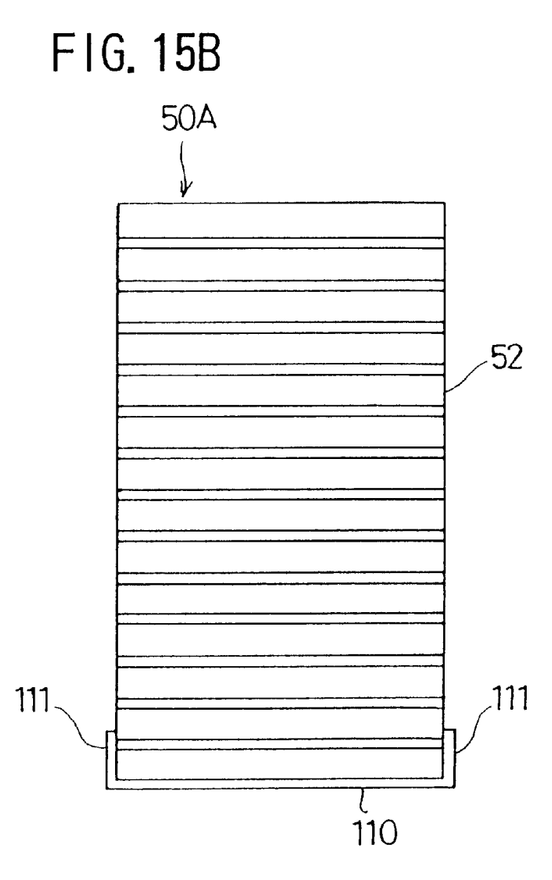

FIGS. 15A and 15B are diagrams showing a socket 30C of a fourth embodiment of the present invention. The socket 30C can be used when the printed-circuit board 70 is vertically disposed as shown in FIG. 15A in the same way as the socket 30B.

The socket 30C has a guide support plate 110 which is fixed on the lower end and extends horizontally therefrom. The guide support plate 110 has guide pieces 111 which are provided on both sides and extends upwardly therefrom.

When the high-density package 50A is mounted on the socket 30C, the high-density package 50A is at first placed on the guide support plate 110 at a position between the guide pieces 111. The high-density package 50A is then pushed in a direction D to be mounted on the socket 30C which is vertically disposed.

The present invention is not limited to the above types of sockets but it is also applicable to other types of sockets.

Further, the present invention is not limited to these embodiments, but variations and modifications may be made without departing from the scope of the present invention.

What is claimed is:

1. A socket for mounting a package, comprising:
   a socket body on which said package is mounted, said socket body having a flexural rigidity which is smaller than a flexural rigidity of a substrate on which said socket is to be mounted; and
   a plurality of contacts which are integrated in said socket body, wherein said socket body comprises a protection cover receiving recess for receiving a part of an I/O pin protection cover provided on said package when said package is mounted on said socket.

2. The socket for mounting a package as claimed in claim 1, comprising a plurality of socket fixing members which are inserted into holes on said substrate.

3. The socket for mounting a package as claimed in claim 1, wherein said socket body further comprises an inclined surface on the top of the protection cover receiving recess for guiding and leading said part of said I/O pin protection cover into said protection cover receiving recess.

4. The socket for mounting a package as claimed in claim 1, wherein said socket body is made of liquid crystalline polymer.

5. The socket for mounting a package as claimed in claim 1, wherein said socket body comprises a shield member which encircles each of said contacts.

6. The socket for mounting a package as claimed in claim 1, wherein said socket body comprises at least two guide pins for guiding guide holes provided on said package when said package is mounted on said socket.

7. The socket for mounting a package as claimed in claim 6, wherein said guide pins have thin parts which are positioned inside said guide holes in a state where said package is mounted on said socket.

8. The socket for mounting a package as claimed in claim 6, wherein said guide pins comprise flaps which project therefrom to prevent said package from slipping off said guide pins.

9. The socket for mounting a package as claimed in claim 1, wherein said socket body comprises a guide support plate which horizontally extends when said socket is vertically disposed for guiding said package which has been placed thereon.

10. A mount structure of a package, comprising a socket having a socket body and a plurality of contacts which are integrated in said socket body, wherein said socket body is mounted on a substrate and said package is mounted on said socket body, wherein said socket has a flexural rigidity which is smaller than a flexural rigidity of said substrate, and wherein said socket body comprises a protection cover receiving recess for receiving a part of an I/O pin protection cover provided on said package when said package is mounted on said socket.

* * * * *